United States Patent [19]
Imamura et al.

[11] Patent Number: 5,512,786
[45] Date of Patent: Apr. 30, 1996

[54] PACKAGE FOR HOUSING SEMICONDUCTOR ELEMENTS

[75] Inventors: Hitomi Imamura; Shin Matsuda; Nobuyuki Ito; Kazuhiro Kawabata, all of Kokubu, Japan

[73] Assignee: Kyocera Corporation, Kyoto, Japan

[21] Appl. No.: 457,427

[22] Filed: Jun. 1, 1995

[30] Foreign Application Priority Data

Aug. 10, 1994 [JP] Japan ................................ 6-18127
Aug. 12, 1994 [JP] Japan ................................ 6-190222

[51] Int. Cl.$^6$ ......................... H01L 23/48; H01L 23/52; H01L 27/40
[52] U.S. Cl. ............................... 257/780; 257/779
[58] Field of Search ......................... 257/780, 781, 257/786, 779, 772

[56] References Cited

U.S. PATENT DOCUMENTS

| | | | |
|---|---|---|---|
| 5,196,726 | 3/1993 | Nishiguchi et al. | 257/780 |
| 5,403,776 | 4/1995 | Tsuji et al. | 257/780 |
| 5,422,516 | 6/1995 | Hosokawa et al. | 257/780 |

*Primary Examiner*—Sara W. Crane
*Assistant Examiner*—S. V. Clark
*Attorney, Agent, or Firm*—Loeb and Loeb

[57] ABSTRACT

A package for housing semiconductor elements including an insulating base which consists of electrical insulation material, and has a mounting portion that mounts semiconductor elements on the upper surface as well as a plurality of depressions on either of the upper surface and the lower surface thereof, a plurality of metallized wiring layers led away from the periphery of the mounting portion and extending to one end surface of the depressions, a plurality of connection pads for electrically connecting the metallized wiring layers formed on the end surface of the depressions of the insulating base and terminals which are soldered to the connection pads, wherein the terminals are accurately attached by solder to designated positions on the connection pads and securely and strongly joined to designated wire conductors of external electronic circuit boards to achieve reliable electrical connections of semiconductor integrated circuit elements housed inside the package to external electronic circuit boards.

5 Claims, 2 Drawing Sheets

PACKAGE FOR HOUSING SEMICONDUCTOR ELEMENTS

BACKGROUND OF THE INVENTION

1. Field of the Invention

The present invention, relates to a package for housing semiconductor elements for the purpose of housing semiconductor integrated circuit elements and the like.

More specifically, the invention relates to a package for housing semiconductor elements that can accurately electrically connect each electrode of semiconductor integrated circuit elements to external electronic circuits.

2. Related Art

In the past, packages for housing semiconductor elements, in particular, semiconductor integrated circuit elements such as LSI (large-scale integrated circuits), were generally made of electrical insulating materials like alumina ceramic and comprised an insulating base having a depression at nearly the center section on top of the packages for housing the semiconductor integrated circuit elements, a plurality of metallized wiring layers formed of high melting point metallic powders such as tungsten or molybdenum led away from the periphery of the depression of the insulating base and extending to the lower surface thereof, a plurality of connection pads formed on the lower surface of the insulating base which are electrically connected to the metallized wiring layer, ball terminals consisting of solder (brazing filler) hard-soldered to the connection pads, and a lid.

Such packages for housing semiconductor elements become a semiconductor device that can be fabricated as a product by attaching the semiconductor integrated circuit elements to the bottom surface of the depression of the insulating base using an adhesive consisting of materials such as glass or resin; electrically connecting each electrode of the semiconductor integrated circuit elements to the metallized wiring layer by means of bonding wires while joining a lid to the upper surface of the insulating base using a sealant such as glass or resin; and hermetically sealing the semiconductor integrated circuit elements inside a container consisting of the insulating base and the lid.

Such semiconductor devices are operably mounted on an external electronic circuit board by installing ball terminals, which are formed of solder hard-soldered to the connection pads on the lower surface of the insulating base, on the wire conductor of the external electronic circuit board to make contact each other; thereafter fusing the ball terminals at about 150° C. to 250° C.; and thereby joining the ball terminals to the wire conductor. Simultaneously, each electrode of the semiconductor integrated circuit elements housed inside the package for housing semiconductor elements is electrically connected to the external electronic circuit by means of a metallized wiring layer and the ball terminals.

However, in these packages for housing semiconductor elements in the prior art, the coefficient of thermal expansion of the insulating base made of alumina ceramic was on the order of $6.5 \times 10^{-6}/°C$., whereas an external electronic circuit board, which is generally made of glass epoxy, has a coefficient of thermal expansion of from $2 \times 10^{-5}/°C$. to $4 \times 10^{-5}/°C$. Because there was a large difference between the two coefficients, when the semiconductor integrated circuit elements were housed inside the package for housing semiconductor elements followed by being operably mounted on the external electronic circuit board and, heat generated while the semiconductor integrated circuit elements are operated was repeatedly applied to both the insulating base and the external electronic circuit board, a large thermal stress occurred between the insulating base of the package and the external electronic circuit board due to the difference of both coefficients of thermal expansion. This stress acted on the peripheral portion of the connection pads on the lower surface of the insulating base to separate the connection pads from the insulating base. A defect that occurred as a result of this was that, over a long period of time, each electrode of the semiconductor integrated circuit elements housed inside the package for housing semiconductor elements could not be electrically connected to the designated external electronic circuits.

As a further example of the package for housing semiconductor elements in the prior art, packages using ball terminals hard-soldered to the connection pads by means of a brazing filler have been known to be used in place of ball terminals which consist of solder brazer mounted to the connection pads.

Such semiconductor devices are operably mounted on the external electronic circuit board by installing ball terminals, which are hard-soldered to connection pads on the lower surface of the insulating base, on the wire conductor of the external electronic circuit board to make contact each other and by joining the both by solder. Simultaneously, each electrode of the semiconductor integrated circuit elements housed inside the package for housing semiconductor elements is electrically connected to the external electronic circuit by means of the metallized wiring layer and ball terminals.

However, these packages for housing semiconductor elements in the prior art had a defect in that the semiconductor elements housed inside could not accurately and reliably provide an electrical connection to the external electronic circuit because of the fact that the connection pads provided on the lower surface of the insulating base were flat and the terminals joined to the wire conductor of the external electronic circuit board were balllike resulting in variations in the hard solder positions due to movement of the ball terminals which occurred easily with these variations making it impossible to install the terminals while making contact and thus joining the wire conductor of the external electronic circuit board.

SUMMARY OF THE INVENTION

It is an object of the present invention to provide a package for housing semiconductor elements in which each electrode of the semiconductor integrated circuit elements housed inside can be accurately, electrically connected to designated external electronic circuits over long periods of time.

It is another object of the invention to provide a package for housing semiconductor elements in which ball terminals can be accurately hard-soldered at designated positions on connection pads formed on the lower or upper surface of an insulating base to securely and strongly join the ball terminals to designated wire conductors of a external electronic circuit board and thereby to allow for the semiconductor integrated circuit elements housed inside to be accurately electrically connected to the external electronic circuits.

In one aspect of the invention, there is provided a package for housing semiconductor elements, the package comprising an insulating base, which consists of electrical insulation material, the insulating base having on the upper surface thereof a mounting portion that mounts the semiconductor elements as well as a plurality of depressions on either of the upper surface and the lower surface thereof; a plurality of metallized wiring layers led away from the periphery of the mounting portion and extending to one end surface of the depressions; a plurality of connection pads for electrically connecting the metallized wiring layers, formed on the end surface of the depressions of the insulating base; and terminals which are soldered to the connection pads, each terminal forming integrally with the soldered portion, a ball protrusion on the surface of the insulating base, wherein the following equations must be satisfied with respect to $D_{1a}$, $D_2$ and d where $D_{1a}$ represents the diameter of the ball protrusion, $D_2$ represents the diameter of the opening of the depression, and d represents the depth of the depression:

$D_2 < D_{1a}$ 0.2 (mm) $\leq D_2 \leq$ 1.0 (mm)

$d \geq 0.05$ (mm)

$0.08 \leq d/D_2 \leq 0.85$

Preferably, the terminal comprises a low melting point lead-tin solder with a lead-to-tin weight ratio of about 6:4.

In another aspect of the invention, there is provided a package for housing semiconductor elements, the package comprising an insulating base, which consists of electrical insulation material, the insulating base having on the upper surface thereof a mounting portion that mounts the semiconductor elements as well as a plurality of depressions on either of the upper surface and the lower surface thereof; a plurality of metallized wiring layers led away from the periphery of the mounting portion and extending to one end surface of the depressions; a plurality of connection pads for electrically connecting the metallized wiring layers, formed on the end surface of the depressions of the insulating base; and ball terminals which are soldered to the connection pads, wherein the following equations must be satisfied with respect to $D_{1b}$, $D_2$ and d where $D_{1b}$ represents the diameter of the ball terminal, $D_2$ represents the diameter of the opening of the depression, and d represents the depth of the depression:

$D_2 < D_{1b}$ 0.2 (mm) $\leq D_2 \leq$ 1.0 (mm)

$D_{1b} - (D_{1b}^2 - D_2^2)^{1/2} \leq 2$ d

Preferably, the ball terminal comprises a high melting point lead-tin solder with a lead-to-tin weight ratio of about 9:1. More preferably, the ball terminal is soldered to the connection pads using a low melting point lead-tin solder with a lead-to-tin weight ratio of about 6:4.

The above objects, as well as further objects, features and advantages of the present invention, will be more fully understood by reference to the following detailed description and the accompanying drawings.

In the above figures, identical reference numericals represent identical (or similar) elements.

DETAILED DESCRIPTION OF THE INVENTION

This invention will be described in detail by way of example with reference to the accompanying drawings.

Figure 1:
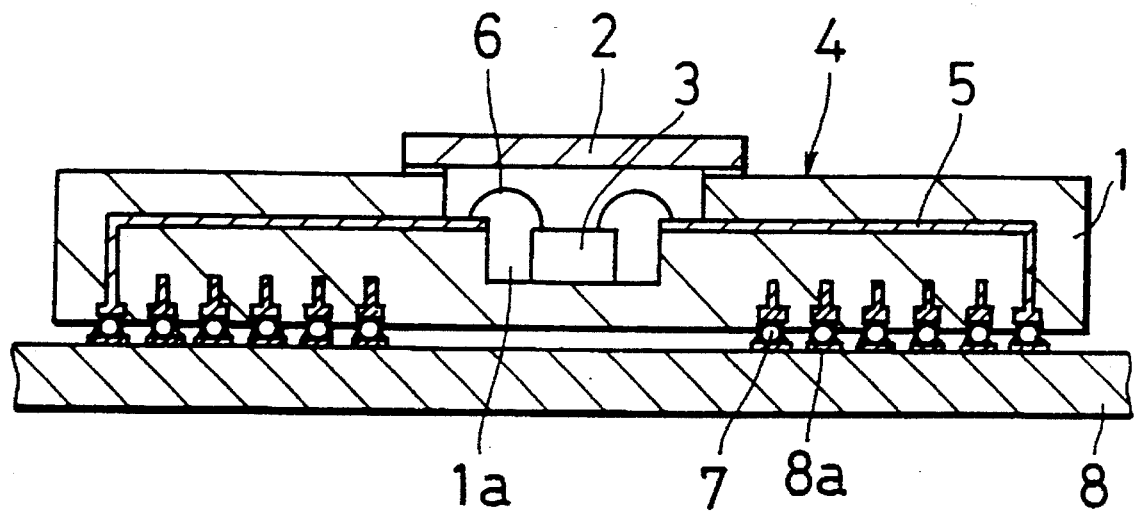
FIG. 1 is a sectional view showing an outline of the package for housing semiconductor of the invention.
Figure 2:
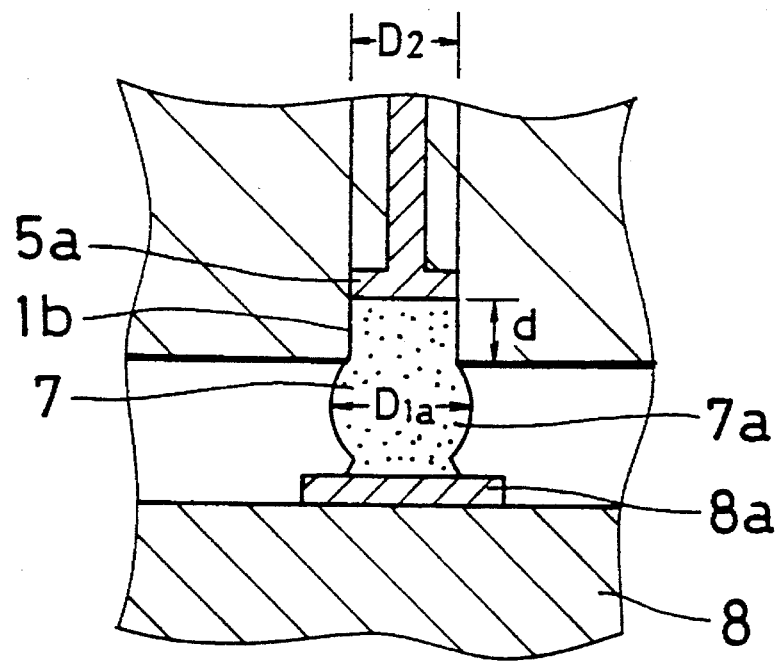
FIG. 2 is a principal expanded sectional view showing an embodiment of the package for housing semiconductor elements shown in FIG. 1.

FIGS. 1 and 2 show a preferred embodiment of the package for housing semiconductor elements according to this invention. In FIG. 1 is there shown an insulating base 1 and a lid 2. This insulating base 1 and lid 2 comprise a package 4 that houses a semiconductor integrated circuit element 3.

At the center section of the upper surface of the insulating base 1, a hollow part 1a is provided in order to house the semiconductor integrated circuit element 3, and the semiconductor integrated circuit element 3 is attached to the bottom surface of the hollow part 1a by an adhesive such as glass or resin.

The insulating base 1 is made of electrical insulation material including aluminum oxide sintered body, mullite sintered body, silicon carbide sintered body, aluminum nitride sintered body, and glass ceramic sintered body. For example, when the insulating base is made of aluminum oxide sintered body, the insulating base is produced by mixing appropriate organic binder, plasticizer and solvent with the raw material powders of aluminum oxide, silicon oxide, magnesium oxide and calcium oxide to prepare a slurry substance, forming a green sheet utilizing the doctor blade method or calendar roll method, applying an appropriate punch process to the green sheet, laminating a plurality of the green sheets and firing the sheets at a temperature of approximately 1600° C.

Furthermore, on the insulating base 1 a plurality of metallized wiring layers 5 are attachably formed from the periphery of the hollow part 1a where the semiconductor integrated circuit element 3 is mounted and housed, and extends to the lower surface of the insulating base.

As shown in FIG. 2, a depression 1b is further provided on the lower surface of the insulating body 1 and on the bottom surface of this depression 1b, a connection pad 5a is attachably formed to be electrically connected to the metallized wiring layer 5.

The metallized wiring layer 5 and connection pad 5a are formed of high melting point metallic powders such as tungsten, molybdenum or manganese. The metallized wiring layer 5 and connection pad 5a are then attachably formed in a designated pattern at a designated position on the insulating base 1 by applying a metal paste, obtained by mixing appropriate organic binder, plasticizer and solvent with a high melting point metallic powder such as tungsten, in a designated pattern to a green sheet that will form the insulating base 1 in accordance with the screen printing method which is well-known in the prior art.

The metallized wiring layer 5 electrically connects each electrode of the semiconductor integrated circuit element 3 to a terminal 7 which is soldered to the connection pad 5a (explained later). Each electrode of the semiconductor integrated circuit element 3 is electrically connected at a region positioned at the periphery of the hollow part 1a of the insulating base 1 by means of a bonding wire 6.

Moreover, the connection pad 5a electrically connecting the metallized wiring layer 5 serves as a substrate metal layer when the terminal 7 is attached to the insulating base 1. The terminal 7 comprising a low melting point lead-tin solder with a lead-to-tin weight ratio of about 6:4 is soldered to the surface of the connection pad 5a.

The terminal 7 soldered to the connection pad 5a is further provided with a ball protrusion 7a on the lower surface of the insulating base 1 and when connecting the terminal 7 to a wire conductor 8a of an external electronic circuit board 8, the ball protrusion 7a functions to make this connection easy and reliable.

The terminal 7 provided with the ball protrusion 7a satisfies $D_2 < D_{1a}$, 0.2 (mm) $\leq D_2 \leq$ 1.0 (mm), $d \geq 0.05$ (mm)

$0.08 \leq d/D_2 \leq 0.85$ when $D_{1a}$ represents the diameter of the ball protrusion 7a, $D_2$ represents the diameter of the opening of the depression 1b, and d represents the depth of the depression 1b. This ensures that the terminal 7 is securely hard-soldered to the connection pad 5a, the semiconductor integrated circuit element 3 is housed inside the hollow part 1a of the insulating base 1, and the package is operably mounted on the external electronic circuit board 8. After this, heat generated while the semiconductor integrated circuit element 3 operates is repeatedly applied to both the insulating base 1 and the external electronic circuit board 8 and, even though a large thermal stress may occur due to the difference of both coefficients of thermal expansion between the insulating base 1 and the external electronic circuit board 8, this thermal stress is dissipated in the regions around both the external periphery of the connection pad 5a and the terminal 7 positioned in the opening of the depression 1b of the insulating base 1, effectively preventing the connection pad 5 from separating from the insulating base 1.

If the diameter $D_{1a}$ of the ball protrusion 7a of the terminal 7 becomes smaller than the diameter $D_2$ of the opening of the depression 1b of the insulating base 1, it becomes impossible to form the ball protrusion 7a on the terminal 7 at a prescribed height thereby making it impossible to accurately and strongly join the terminal 7 to the designated wire conductor 8a of the external electronic circuit board 8. Therefore, the diameter $D_{1a}$ of the ball protrusion 7a of the terminal 7 is specified to be larger than the diameter $D_2$ of the opening of the depression 1b of the insulating base 1.

Furthermore, if the diameter $D_2$ of the opening of the depression 1b of the insulating base 1 is smaller than 0.2 mm, the connection pad 5a and the terminal 7 cannot be strongly soldered and, if it is larger than 1.0 mm, the gap between neighboring depressions 1b will narrow thereby making it easy for a contact short-circuit to occur between the ball protrusions 7a of the neighboring terminals 7 when the terminal 7 having the ball protrusion 7a on the lower surface of the insulating base 1 is formed, which in turn makes it impossible to form with high density terminals 7 having the ball protrusion 7a on the lower surface of the insulating base 1. Consequently, the diameter $D_2$ of the opening of the depression 1b of the insulating base 1 is specified to be within a range from 0.2 mm to 1.0 mm.

Further, if the depth d of the depression 1b of the insulating base 1 is less than 0.05 mm, when heat generated while the semiconductor integrated circuit element 3 operates is repeatedly applied to both the insulating base 1 and the external electronic circuit board 8 and, a large thermal stress occurs due to the difference of both coefficients of thermal expansion between the insulating base 1 and the external electronic circuit board 8, it becomes impossible to effectively dissipate this thermal stress in the regions around both the external periphery of the connection pad 5a and the terminal 7 positioned in the opening of the depression 1b of the insulating base 1. Consequently, the depth d of the depression 1b of the insulating base 1 is specified to be 0.05 mm or more.

Continuing further with the relationship between the diameter $D_2$ of the opening of the depression 1b of the insulating base 1 and the depth d of the depression 1b, if $d/D_2 \leq 0.08$, when heat generated while the semiconductor integrated circuit element 3 operates is repeatedly applied to both the insulating base 1 and the external electronic circuit board 8 and, a large thermal stress occurs due to the difference of both coefficients of thermal expansion between the insulating base 1 and the external electronic circuit board 8, it becomes impossible to effectively dissipate this thermal stress in the regions around both the external periphery of the connection pad 5a and the terminal 7 positioned in the opening of the depression 1b of the insulating base 1 and moreover, if $d/D_2 \geq 0.85$, material inside the depression 1b is absorbed into the ball protrusion portion 7a of the terminal 7, which comprises solder, results in an incomplete electrical connection between the terminal 7 and the connection pad 5a. Consequently, the relationship between the diameter $D_2$ of the opening of the depression 1b of the insulating base 1 and the depth d of the depression 1b is specified to be $0.08 \leq d/D_2 \leq 0.85$.

The terminal 7 having the ball protrusion 7a is formed on the lower surface of the insulating base 1 by first filling excessive solder into the depression 1a of the insulating base 1 and then fusing this solder at a temperature of from about 150° C. to 250° C. In this case, the solder protruding from the depression 1a of the insulation base 1 forms the ball protrusion 7a by surface tension.

In this way, the package for housing semiconductor elements according to the invention becomes a semiconductor device that can be fabricated as a product by attaching the semiconductor integrated circuit elements 3 to the bottom surface of the depression 1a of the insulating base 1 using an adhesive; electrically connecting each electrode of the semiconductor integrated circuit elements 3 to the metallized wiring layer 5 by means of bonding wires; joining the lid 2 to the upper surface of the insulating base 1 using a sealant such as glass or resin; and hermetically sealing the semiconductor integrated circuit elements 3 inside a container 4 consisting of the insulating base 1 and the lid 2.

A package for housing semiconductor elements of the invention comprises an insulating base, which consists of electrical insulation material, the insulating base having on the upper surface thereof a mounting portion that mounts the semiconductor elements as well as a plurality of depressions on either of the upper surface and the lower surface thereof; a plurality of metallized wiring layers led away from the periphery of the mounting portion and extending to one end surface of the depressions; a plurality of connection pads for electrically connecting the metallized wiring layers, formed on the end surface of the depressions of the insulating base; and terminals which are soldered to the connection pads, each terminals forming integrally with the soldered portion, a ball protrusion on the surface of the insulating base, and the package is characterized in that $D_2 < D_{1a}$, $0.2$ (mm) $\leq D_2 \leq 1.0$ (mm), $d \geq 0.05$ (mm) $0.08 \leq d/D_2 \leq 0.85$ when $D_{1a}$ represents the diameter of the ball protrusion, $D_2$ represents the diameter of the opening of the depression and d represents the depth of the depression. Consequently, the terminal can be securely attached by hard-solder to the connection pad, and when the package is operably mounted on the external electronic circuit board while simultaneously housing the semiconductor integrated circuit element inside the package, heat generated while the semiconductor integrated circuit element operates is repeatedly applied to both the insulating base and the external electronic circuit board and, even though a large thermal stress occurs due to the difference of both coefficients of thermal expansion between the insulating base of the package and the external electronic circuit board, this thermal stress is dissipated in the regions around both the external periphery of the connection pad and the terminal positioned in the opening of the depression of the insulating base. As a result, the connection pads do not separate from the insulating base and allow each electrode of the semiconductor integrated circuit elements housed inside the package for housing semiconductor elements to be accurately electrically connected to a designated external electronic circuit over a long period of time.

Figure 3:
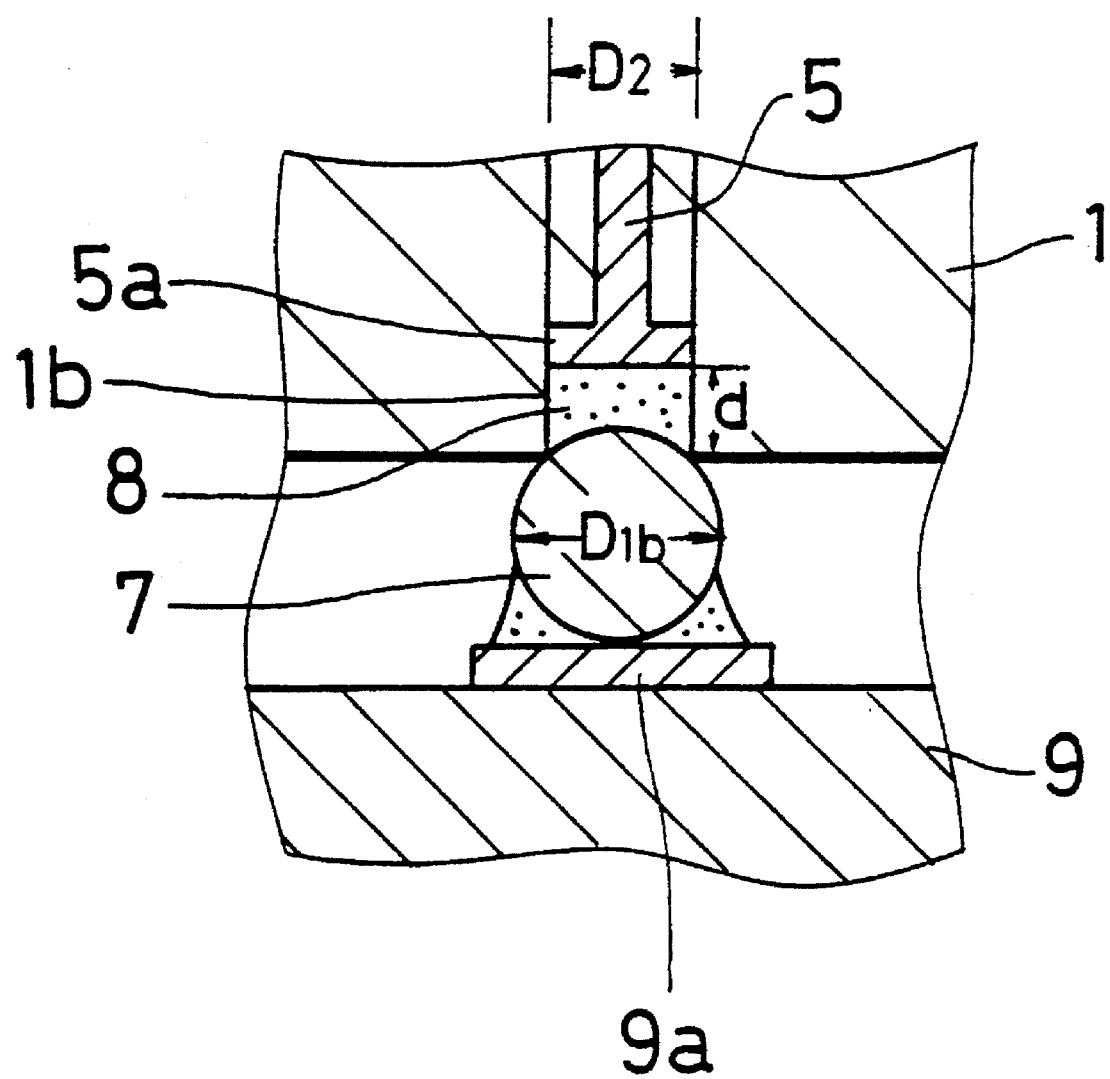
FIG. 3 is a principal expanded sectional view showing another embodiment of the package for housing semiconductor elements shown in FIG. 1.

FIG. 3 shows another preferred embodiment of the package for housing semiconductor elements according to the invention. Similar to FIG. 2, FIG. 3 is a principal expanded sectional view showing the vicinity of the lower surface of the depression 1b of the insulating base 1. As shown in FIG. 1, the schematic construction of the package according to this embodiment is essentially identical to the previous embodiment. Therefore, detailed explanation is omitted with only the different portions being explained referring to FIG. 3.

The connection pad 5a electrically connecting the metallized layer 5 serves as a substrate metal layer when the ball terminal 7 is attached to the insulating base 1 and the ball terminal 7 is soldered to the surface of the connection pad 5a using brazing filler material 8 such as a low melting point lead-tin solder with a lead-to-tin weight ratio of 6:4. For example, the ball terminal 7 comprises a high melting point lead-tin solder with a lead-to-tin weight ratio of 9:1.

In soldering the ball terminal 7 to the connection pad 5a, $D_2 \leq D_{1b}$, 0.2 mm $\leq D_2 \leq$ 1.0 mm, $D_{1b} - (D_{1b}^2 - D_2^2)^{1/2} \leq 2d$ are satisfied when $D_{1b}$ represents the diameter of the ball terminal, $D_2$ represents the diameter of the opening of the depression 1b, and d represents the depth of the depression 1b. Thereby, the ball terminal 7 is soldered with reliable positioning at a designated position on the connection pad 5a without being completely embedded inside the depression 1b and only one portion protruding while the movement on the connection pad 5a of the ball terminal 7 is restricted by the depression 1b. Therefore, because the ball terminal 7 is soldered at a designated position on the connection pad 5a in the package for housing semiconductor elements, when the ball terminal 7 is joined to the wire conductor 9b of the external electronic circuit board 9, that joint is extremely reliable and secure, thus allowing the electrodes of the semiconductor integrated circuit elements 3 housed inside the package for housing semiconductor elements to be accurately and securely electrically connected to the designated external electronic circuit.

Furthermore, if the diameter $D_2$ of the opening of the depression becomes larger than the diameter $D_1$ of the ball terminal, the ball terminal 7 will be embedded inside the depression 1b of the insulating base 1 and will not protrude from the lower surface of the insulating base when the ball terminal 7 is soldered to the connection pad 5a. Consequently, the diameter $D_2$ of the opening of the depression 1b is specified to be smaller than the diameter $D_1$ of the ball terminal.

Furthermore, if the diameter $D_2$ of the opening of the depression is smaller than 0.2 mm, when the connection pad 5a and the terminal 7 are soldered, the strength of the solder joint will become weak along with the possibility of a cut in the electrical connection between the connection pad 5a and the ball terminal 7 occurring easily. Also, if it is larger than 1.0 mm, the overall shape of the package for housing semiconductor elements will increase in size and preclude itself from being installed in an electronic device with increasing compactness when the number of electrodes becomes very large in correspondence with the tendency toward the high density of the semiconductor integrated circuit elements 3. Consequently, the diameter $D_2$ of the opening of the depression 1b is specified to be within a range from 0.2 mm to 1.0 mm.

Continuing further with the relationship between the diameter $D_{1b}$ of the ball terminal 7, the diameter $D_2$ of the opening of the depression 1b and the depth d of the depression 1b, if $D_{1b} - (D_{1b}^2 - D_2^2)^{1/2} \leq 2d$, the movement restriction rendered by the depression 1b of the ball terminal 7 will be insufficient, making it impossible to accurately solder the ball terminal 7 at the designated position on the connection pad 5a when the ball terminal 7 is soldered to the connection pad 5a. Consequently, the relationship between the diameter $D_{1b}$ of the ball terminal 7, the diameter $D_2$ of the opening of the depression 1b and the depth d of the depression 1b is specified to be $D_{1b} - (D_{1b}^2 - D_2^2)^{1/2} \leq 2d$.

As previously stated, when the ball terminal 7 comprise a high melting point lead-tin solder, the terminal is joined to the wire conductor 9a of the external electronic circuit board 9 using a low melting point solder such as low melting point lead-tin solder. Then, because the ball terminal 7 is accurately soldered at the designated position on the connection pad 5a by means of the depression 1b formed on the connection pad 5a, the joint between the wire conductor 9a of the external electronic circuit board 9 and the ball terminal 7 is very precise, thereby allowing the electrodes of the semiconductor integrated circuit elements 3 housed inside the package for housing semiconductor elements to be accurately and securely electrically connected to the designated external electronic circuit by means of the ball terminals 7.

In this way, as stated above, the package for housing semiconductor elements according to this embodiment can also be fabricated as a semiconductor device product.

Another package for housing semiconductor elements of the invention comprises an insulating base, which consists of electrical insulation material, the insulating base having on the upper surface thereof a mounting portion that mounts the semiconductor elements as well as a plurality of depressions on either of the upper surface and the lower surface thereof; a plurality of metallized wiring layers led away from the periphery of the mounting portion and extending to one end surface of the depressions; a plurality of connection pads for electrically connection the metallized wiring layers, formed on the end surface of the depressions of the insulating base; and ball terminals which are soldered to the connection pads, and the package is characterized in that $D_2 < D_{1b}$, 0.2 (mm) $\leq D_2 \leq$ 1.0 (mm), $D_{1b} - (D_{1b}^2 - D_2^2)^{1/2} \leq 2d$ when $D_{1b}$ represents the diameter of the ball terminal, $D_2$ represents the diameter of the opening of the depression, and d represents the depth of the depression. Consequently, when the ball terminal is soldered to the connection pad mounted to the bottom surface of the depression on the lower surface of the insulation base, the ball terminal can be soldered with reliable positioning at a designated position on the connection pad without being completely embedded inside the depression and only one portion protruding while the movement on the connection pad of the ball terminal is restricted by the depression. As a result, when the ball terminal of the package for housing semiconductor elements is joined to the wire conductor of the external electronic circuit board, that joint is very reliable and secure, thus allowing the electrodes of the semiconductor integrated circuit elements housed inside the package for housing semiconductor elements to be accurately and securely electrically connected to the designated external electronic circuit.

Although this invention has been described by way of several embodiments thereof, it should be realized that many alternatives, modifications, and variations will be apparent to those skilled in the art of the foregoing description. Accordingly, it is intended to embrace all such alternatives, modifications, and all variations as falling within the spirit and broad scope of the appended claims.

What is claimed is:

1. A package for housing semiconductor elements, the package comprising:

an insulating base, comprising electrical insulation material, the insulating base having on the upper surface thereof, a mounting portion that mounts the semiconductor elements as well as a plurality of depressions on either of the upper surface and the lower surface thereof;

a plurality of metallized wiring layers led away from the periphery of the mounting portion and extending to one end surface of the depressions;

a plurality of connection pads for electrically connecting the metallized wiring layers, formed on the end surface of the depressions of the insulating base; and terminals which are soldered to the connection pads, each terminal forming integrally with the soldered portion, a ball protrusion on the surface of the insulating base, wherein the following equations must be satisfied with respect to $D_{1a}$, $D_2$ and d where $D_{1a}$ represents the diameter of the ball protrusion, $D_2$ represents the diameter of the opening of the depression, and d represents the depth of the depression:

$D_2 < D_{1a}$ $0.2 \text{ (mm)} \leq D_2 \leq 1.0 \text{ (mm)}$ $d \geq 0.05 \text{ (mm)}$ $0.08 \leq d/D_2 \leq 0.85$.

2. The package for housing semiconductor elements according to claim 1, wherein the terminal comprise a low melting point lead-tin solder with a lead-to-tin weight ratio of about 6:4.

3. A package for housing semiconductor elements, the package comprising:

an insulating base, comprising electrical insulation material, the insulating base having on the upper surface thereof, a mounting portion that mounts the semiconductor elements as well as a plurality of depressions on either of the upper surface and the lower surface thereof;

a plurality of metallized wiring layers led away from the periphery of the mounting portion and extending to one end surface of the depressions;

a plurality of connection pads for electrically connecting the metallized wiring layers, formed on the end surface of the depressions of the insulating base; and ball terminals which are soldered to the connection pads, wherein the following equations must be satisfied with respect to $D_{1b}$, $D_2$ and d where $D_{1b}$ represents the diameter of the ball terminal, $D_2$ represents the depth of the depression, and d represents the depth of the depression:

$D_2 < D_{1b}$ $0.2 \text{ (mm)} \leq D_2 \leq 1.0 \text{ (mm)}$ $D_{1b} - (D_{1b}^2 - D_2^2)^{1/2} \leq 2d$.

4. The package for housing semiconductor elements according to claim 3, wherein the ball terminal comprises a high melting point lead-tin solder with a lead-to-tin weight ratio of about 9:1.

5. The package for housing semiconductor elements according to claim 4, wherein the ball terminal is soldered to the connection pads using a low melting point lead-tin solder with a lead-to-tin weight ratio of about 6:4.

* * * * *